(12) United States Patent
Abe et al.

(10) Patent No.: US 6,664,133 B2
(45) Date of Patent: Dec. 16, 2003

(54) LEAD FRAME AND METHOD OF MANUFACTURING THE SAME

(75) Inventors: Akinobu Abe, Nagano (JP); Tatsuya Inatsugu, Nagano (JP); Hiroyuki Komatsu, Nagano (JP); Hideki Matsuzawa, Nagano (JP); Hideki Toya, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/265,776

(22) Filed: Oct. 8, 2002

(65) Prior Publication Data

US 2003/0067058 A1 Apr. 10, 2003

(30) Foreign Application Priority Data

Oct. 10, 2001 (JP) ........................................ 2001-312199

(51) Int. Cl.$^7$ ............................................... H01L 21/44
(52) U.S. Cl. ........................................ 438/111; 438/123
(58) Field of Search ................................ 438/110, 111, 438/121, 123

(56) References Cited

U.S. PATENT DOCUMENTS

| | | | | |
|---|---|---|---|---|
| 4,803,540 A | * | 2/1989 | Moyer et al. | 257/669 |
| 4,820,658 A | * | 4/1989 | Gilder, Jr. et al. | 438/111 |
| 5,926,695 A | * | 7/1999 | Chu et al. | 438/111 |
| 6,294,409 B1 | * | 9/2001 | Hou et al. | 438/123 |

* cited by examiner

*Primary Examiner*—Chandra Chaudhari
(74) *Attorney, Agent, or Firm*—Armstrong, Kratz, Quintos, Hanson & Brooks, LLP

(57) ABSTRACT

In a lead frame which comprises lead portions extended from a frame portion toward an inside like a teeth of a comb and each having a top end portion, a center portion, and a base portion connected to the frame portion, the top end portion and the center portion are connected via a first constriction portion, and the center portion and the base portion are connected via a second constriction portion, and thickness of both side surface portions of the center portion and the top end portion of each lead portion are set thinner than thickness of remaining portions of each lead portion.

2 Claims, 9 Drawing Sheets

LEAD FRAME AND METHOD OF MANUFACTURING THE SAME

BACKGROUND OF THE INVENTION

1. Field of the Invention

The present invention relates to a lead frame and a method of manufacturing the same and, more particularly, a lead frame employed in a leadless package such as QFN, SON, etc. and a method of manufacturing the same.

2. Description of the Related Art

In recent years, the development of the LSI technology, which is the key technology to implement the multimedia devices, has advanced steadily toward the higher speed and the larger capacity of the data transmission. According to this, the higher density of the packaging technology as the interface between the LSI and the electronic device is advanced.

As the package that can accommodate the high density packaging, various packages have been developed. As the package for the high density packaging using the lead frame, for example, the leadless packages such as QFN (Quad Flat Non-leaded Package), SON (Small Outline Non-leaded Package), etc., in which the leads are not extended to the out side, have been known.

FIG. 1A is a sectional view showing an example of a semiconductor device in which an IC chip is installed into the leadless package, and FIG. 1B is an enlarged sectional view taken along a II—II line in FIG. 1A. FIG. 2A is a plan view showing an example of a lead portion of the lead frame employed in the leadless package, and FIG. 2B is a sectional view taken along a III—III line in FIG. 2A.

As shown in FIG. 1A, in a semiconductor device 110, an IC chip 104 is mounted on a die pad 102 and connection electrodes (not shown) of the IC chip 104 are connected electrically to lead portions 100 via wires. Then, the IC chip 104 is sealed with a mold resin 106 to cover up to the top end portion of the lead portions 100.

In this manner, in the semiconductor device 110 having the QFN structure, upper surfaces and side surfaces of the lead portions 100 are covered with the mold resin 106. Therefore, if a cross section of the lead portion 100 is a perpendicular shape, for example, it is possible that the lead portions 100 buried in the mold resin 106 come off the mold resin 106.

Therefore, as shown in FIGS. 2A and 2B, a sectional structure of the lead portion 100 of the lead frame is formed like the inverse-taper shape, two-stepped shape, etc., for example, in which a width of a surface (a surface that is connected to the connection electrode of the IC chip) is thicker than a width of a back side (a surface that is connected to the wiring board, etc.).

As a result, as shown in FIG. 1B, the mold resin 106 can be buried to cut into side surfaces of the lead portions 100. Thus, the lead portions 100 can be prevented from coming off the mold resin 106.

In the prior art, in order to form the lead portions 100 having the above sectional structure, first almost same patterns of the resist films are formed on both surfaces of the metal plate. Then, predetermined portions of the metal plate are etched from both surfaces by the wet etching using the chemicals, etc. while using the patterns of the resist films as a mask. At this time, if the etching is not applied to the surface and the back side of the metal plate under the same condition and, for example, the etching is applied exces-sively to the back side, the lead portion whose width on the surface is thicker than a width on the back side can be formed.

As described above, in the prior art, in order to form the inverse taper shape, etc. simply, the lead frame employed in the leadless package is mainly manufactured by the wet etching.

However, the method of working the lead frame by the wet etching has the fatal defect such that the cost is high and the working speed is slow. For this reason, the method of manufacturing the lead frame having the lead portions of the above sectional structure such as the inverse-taper shape, the two-stepped shape, etc. by applying the punching, etc. to the metal plate by means of the precision stamping die, which makes possible the low cost and the high working speed, is expected earnestly.

SUMMARY OF THE INVENTION

It is an object of the present invention to provide a lead frame that can be manufactured by the stamping to use the precision stamping die and can be employed in a leadless package, and a method of manufacturing the same.

The present invention provides a lead frame which comprises lead portions extended from a frame portion toward an inside like a teeth of a comb, the lead portions including a top end portion, a center portion, and a base portion connected to the frame portion; wherein the top end portion and the center portion are connected via a first constriction portion, and the center portion and the base portion are connected via a second constriction portion, and thickness of both side surface portions of the center portion and the top end portion of the lead portions is set thinner than thickness of remaining portions of the lead portions.

The present invention improves the structure of the lead portion so as to make it possible to manufacture the lead frame that can be fitted to the leadless package whose lead portions are not extended to the outside of the sealing resin, i.e., the lead frame in which a sectional structure of the lead portion is formed like the inverse-taper shape, two-stepped shape, etc., by the stamping to use the precision stamping die without the disadvantage.

As the result of earnest study of the method that manufactures the above lead frame by the precision stamping die, the inventors of the present invention found the problems described in the following.

In order to manufacture the lead frame having the lead portions a sectional structure of which is formed like the inverse-taper shape, two-stepped shape, etc. by the stamping to use the precision stamping die, as shown in FIG. 3A, first original forms of lead portions 10 are formed by punching predetermined portions of a metal plate vertically sequentially by a predetermined punch of a die. At this time, the lead portion 10 comprises a main portion 10*a* and a base portion 10*b* connected to a frame portion 10*c*, and the main portion 10*a* is formed to have a larger width than a width of the base portion 10*b*.

Then, as shown in FIG. 3C, side surface portions 10*d* of the main portion 10*a* of the lead portion 10 is pushed by a side-surface portion punch 12 to reduce a thickness, so that a two-stepped shape is formed. At this time, the so-called burr is ready to occur on the almost right-angle portion (C portion) at which a width is expanded from the base portion 10*b* of the lead portion 10 to the main portion 10*a*, due to the displacement of the side-surface portion punch 12.

Then, as shown in FIG. 3E, a top end portion 10*e* of the main portion 10*a* of the lead portion 10 is pushed by a top-end portion punch 12a to reduce a thickness, so that a two-stepped shape is formed. At this time, the burr is ready to occur on the portion (D portion) at which the portion, which is pushed by the top-end portion punch 12a, of the main portion 10a of the lead portion 10 intersects with the portion pushed by the side-surface portion punch 12. In this case, the reason why the side surface portions of the main portion and the top end portion of the lead portion are pushed by separate punches is that the integral formation of the punch that can push both the side surface portions and the top end portion collectively is difficult from the aspect of the strength of the punch member.

The present invention is invented based on the generation of the above disadvantage when the side surface portions and the top end portion of the lead portion are formed to have the two-stepped shape by the stamping to use the precision stamping die. In other words, the lead portion comprises the top end portion, the center portion, and the base portion, and side surface portions of the center portion and the top end portion of the lead portion are connected via a first constriction portion, and the side surface portions of the center portion and the base portion of the lead portion are connected via a second constriction portion.

Therefore, in order to shape the side surface portions of the center portion of the lead portion into the two-stepped shape, first the almost right-angle portion mentioned as above can be eliminated when the side surface portions of the center portion of the lead portion are pushed by the side-surface portion punch of the die. Thus, generation of the burr can be prevented. Then, the top end portion of the lead portion and the side surface portions of the center portion are connected via the first constriction portion when the top end portion of the lead portion is pushed by the top-end portion punch. Therefore, the portion at which the portion pushed by the top-end portion punch intersects with the side surface portions of the center portion pushed by the side-surface portion punch can be eliminated. As a result, generation of the burr can also be prevented.

DESCRIPTION OF THE PREFERRED EMBODIMENTS

Embodiments of the present invention will be explained with reference to the drawings hereinafter.

(Examination Made by the Inventors of the Present Invention)

Figure 1A:
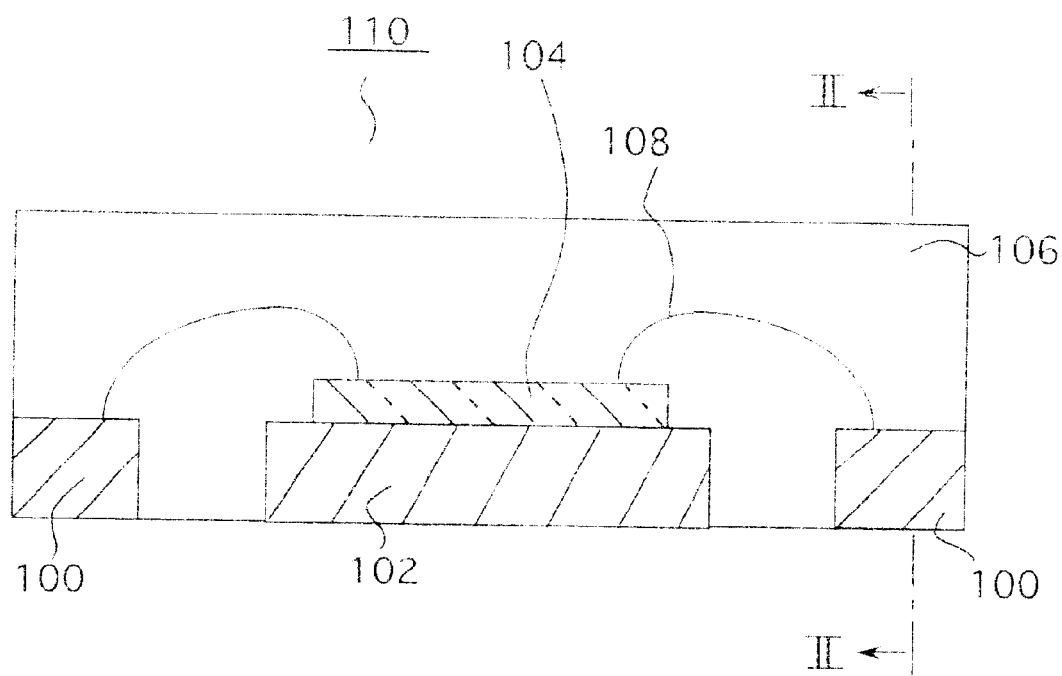
FIG. 1A is a sectional view showing an example of a semiconductor device in which an IC chip is installed into a leadless package.
Figure 1B:
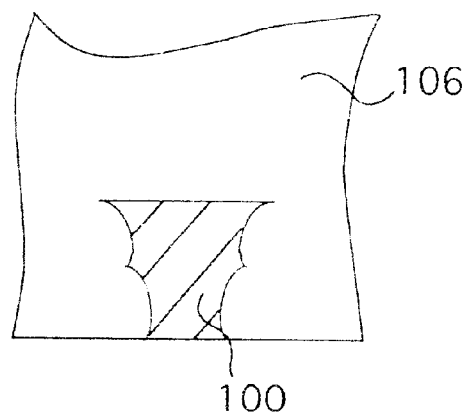
FIG. 1B is an enlarged sectional view taken along a II—II line in FIG. 1A.
Figure 2A:
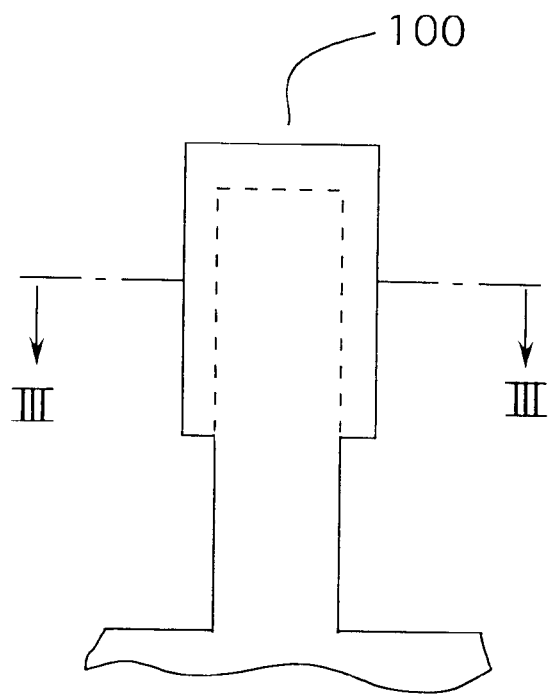
FIG. 2A is a plan view showing an example of a lead portion of a lead frame employed in the leadless package.
Figure 2B:
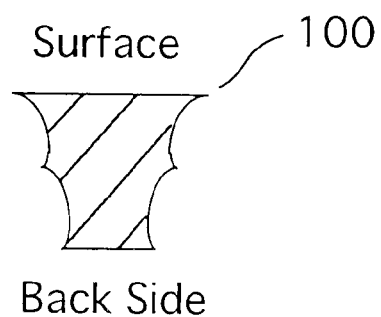
FIG. 2B is a sectional view taken along a III—III line in FIG. 2A.
Figure 3A:
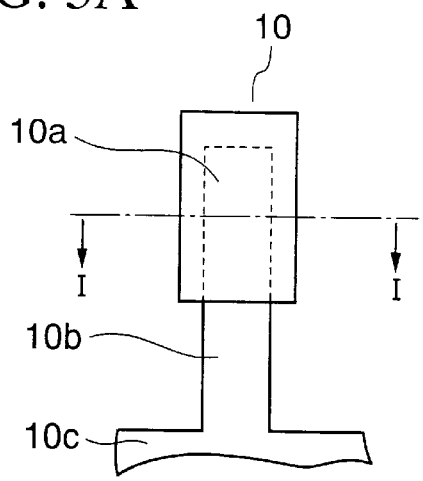
FIGS. 3A and 3B are a partial plan view and a partial sectional view showing a lead portion of the lead frame employed in the leadless package respectively.
Figure 3B:
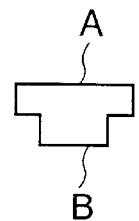
Figure 3C:
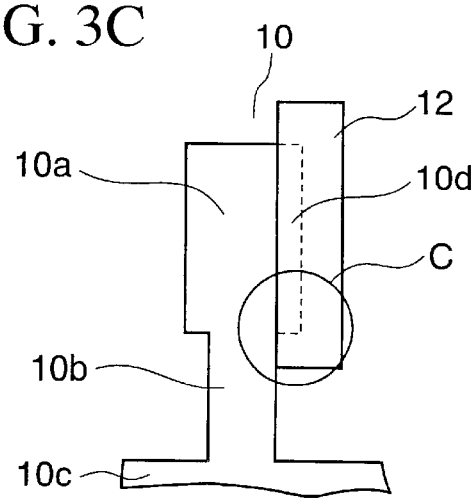
FIGS. 3C and 3D are a partial plan view and a partial sectional view showing the behavior that side surface portions of the lead portion is pressed by a punch of the die respectively.
Figure 3D:
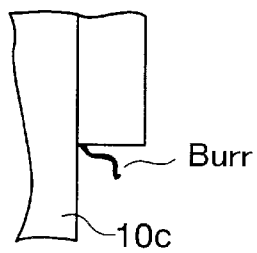
Figure 3E:
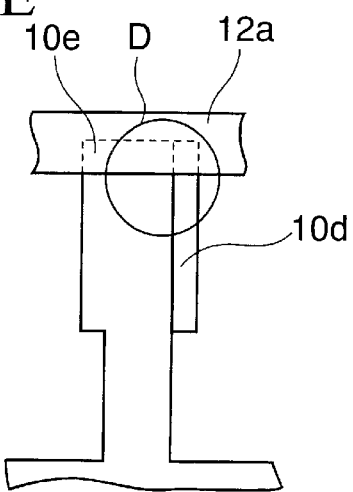
FIGS. 3E and 3F are a partial plan view and a partial sectional view showing the behavior that a top end portion of the lead portion is pressed by the punch of the die respectively.
Figure 3F:
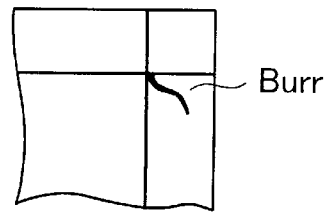

FIG. 3A is a partial plan view showing a lead portion of the lead frame employed in the leadless package, and FIG. 3B is a partial sectional view taken along a I—I line in FIG. 3A; and FIG. 3C is a partial plan view showing the behavior that side surface portions of the lead portion are pressed by a punch of the die, and FIG. 3D is an enlarged partial sectional view showing a C portion in FIG. 3C; and FIG. 3E is a partial plan view showing the behavior that a top end portion of the lead portion is pressed by the punch of the die, and FIG. 3F is an enlarged partial sectional view showing a D portion in FIG. 3E.

As shown in FIG. 3A, a lead portion 10 of a lead frame, which is employed in the leadless package such as QFN, SON, etc., comprises a main portion 10a, and a base portion 10b whose width is narrower than the main portion 10a. The base portion 10b is connected to a frame portion 10c. This main portion 10a is formed like a shape whose width of a surface (A portion) is wider than a width of a back side (B portion), e.g., so-called stepped shape, as shown in FIG. 3B. This surface (A portion) of the lead portion 10 is connected electrically to a connection electrode (not shown) of the IC chip mounted on a die pad via a wire. Also, a mold resin (not shown) is applied to a region that extends from the IC chip to the main portion 10a of the lead portion 10. Then, the leadless package is completed by cutting a predetermined portion of the base portion 10b of the lead portion 10. Then, the back side (B portion) of the lead portion 10 is connected to the wiring board, or the like.

In this manner, in the leadless package, such a structure is employed that the surface side and the side surface side of the lead portion 10 are covered with the mold resin and the back side (B portion) is exposed. Thus, it is possible that, when a cross section of the lead portion 10 is a perpendicular shape, for example, the lead portion 10 comes off the mold resin. Therefore, in the case that a sectional shape of the lead portion 10 is formed like a stepped shape, as shown in FIG. 3B, for example, to cause the mold resin to cut into the side surface, the lead portion 10 is prevented from getting out of the mold resin.

When the inventors of the present invention studied earnestly the method of manufacturing the lead frame, which has the lead portion 10 with a sectional structure shown in FIG. 3B, by the stamping to use the die, they found that such method has the problems described in the following.

In order to form the lead portion 10 having the sectional structure shown in FIG. 3B by the stamping, first the lead frame having the lead portion 10, which is connected to the frame portion 10c shown in FIG. 3C, is manufactured by the stamping. At this time, a cross section of the lead portion 10 is an almost perpendicular shape.

Then, as shown in FIG. 3C similarly, the side surface portions 10d of the main portion 10a of the lead portion 10 is pushed by a die having a punch 12 to reduce a thickness of this portion. Thus, as shown in FIG. 3D, the stepped shape is formed on the side surface portions 10d of the main portion 10a of the lead portion 10 along an end portion of the punch 12. At this time, it is difficult to mate perfectly the edge portion of the side surface of the punch 12 with the edge portion of the side surface of the base portion 10b. Therefore, the punch 12 is positioned to deviate from the edge portion of the side surface of the base portion 10b to the out side, for example, to push the side surface portions 10d of the main portion 10a. Due to this displacement of the punch 12, the so-called burr is ready to occur at the almost right-angle portion that connects the base portion 10b and the main portion 10a (the C portion in FIG. 3C).

Then, as shown in FIG. 3E, a punch 12a of the die is pushed against a top end portion 10e of the main portion 10a of the lead portion 10 to reduce the thickness of this portion, and then the stepped shape is formed at the top end portion 10e of the main portion 10a of the lead portion 10 along the end portion of the punch 12a. At this time, as shown in FIG. 3E, the burr is ready to generate at the intersecting portion between the side surface portions 10d and the top end portion 10e of the pushed main portion 10a (D portion in FIG. 3E). In the case that the leadless package is manufactured by using such lead frame in which the burr is generated on the lead portion 10, the reliability of the package is lowered. Incidentally, if the punch of the die that can push collectively the side surface portions 10d and the top end portion 10e of the pushed main portion 10a of the lead portion 10 is used, the burr is hard to occur at the D portion in FIG. 3E. However, it is difficult to fabricate a punch, in which above two punches 12, 12a are formed integrally, from the aspect of the strength of the punch portion.

In this manner, the inventors of the present invention found that, when it is tried to form the lead portion 10 in which the side surface portions 10d and the top end portion 10e are formed like the stepped shape, as shown in FIG. 3A, by the stamping, there is the problem such that the burr is ready to occur at the C portion in FIG. 3C and the D portion in FIG. 3E.

(First Embodiment)

Figure 5A:
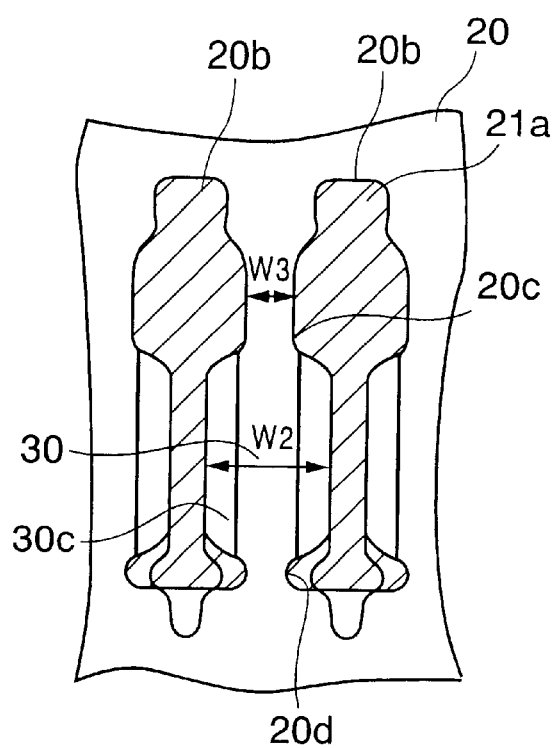
FIGS. 5A, 5C and FIG. 5B are partial plan views and a partial sectional view (#2) showing the lead frame manufacturing method according to the first embodiment of the present invention respectively.
Figure 5B:
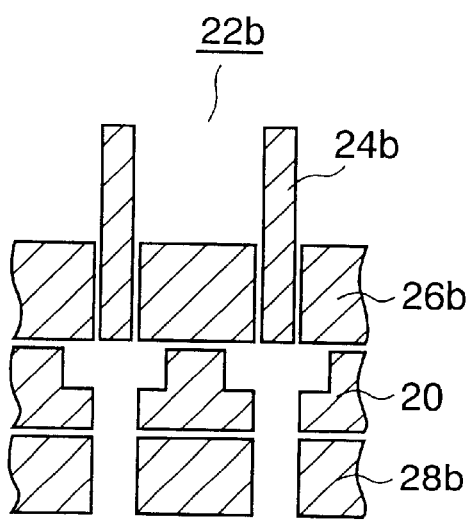
Figure 5C:
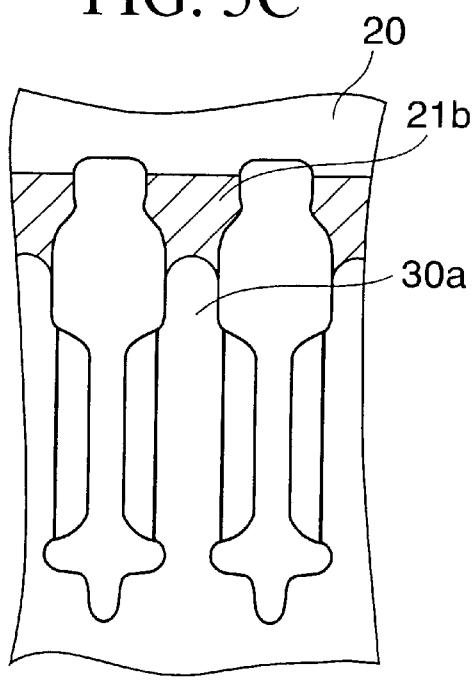
Figure 6A:
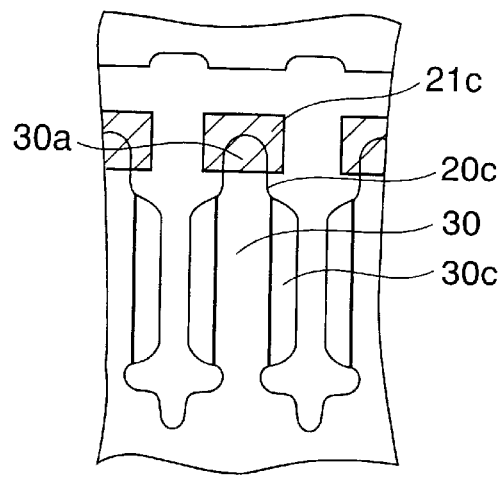
FIGS. 6A to 6C are partial sectional views (#3) showing the lead frame manufacturing method according to the first embodiment of the present invention.
Figure 6B:
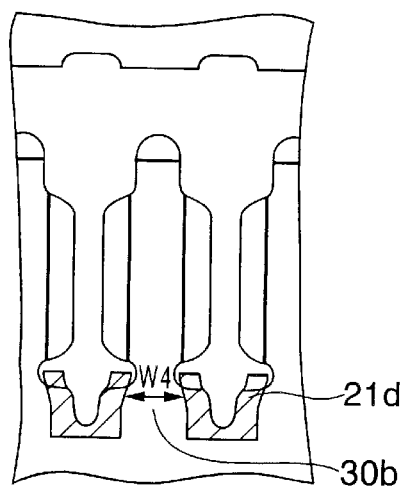
Figure 6C:
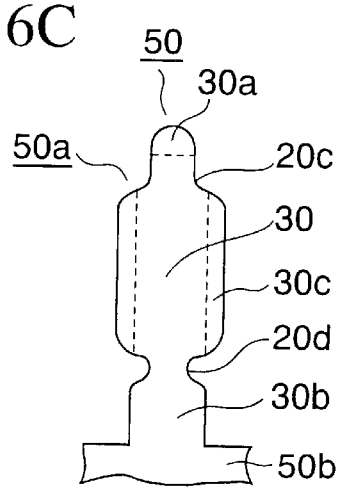

A lead frame manufacturing method according to a first embodiment of the present invention is invented based on the above problem. FIGS. 4A, 4C and FIGS. 4B, 4D are partial plan views and partial sectional views (#1) showing the lead frame manufacturing method according to the first embodiment of the present invention respectively, FIGS. 5A, 5C and FIG. 5B are partial plan views and a partial sectional view (#2) showing the lead frame manufacturing method according to the first embodiment of the present invention respectively, and FIGS. 6A to 6C are partial sectional views (#3) showing the lead frame manufacturing method according to the first embodiment of the present invention.

Figure 4A:
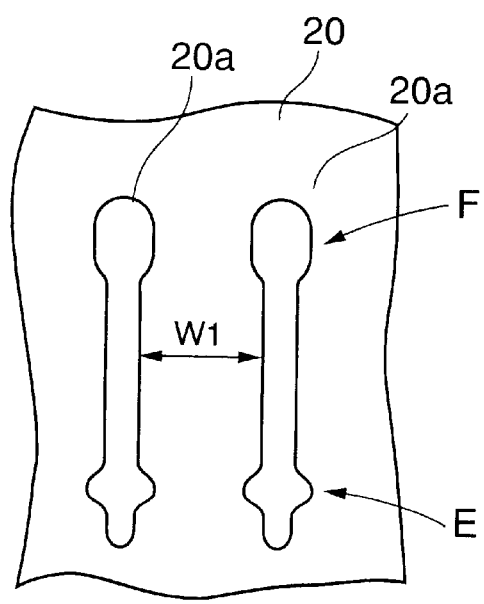
FIGS. 4A, 4C and FIGS. 4B, 4D are partial plan views and partial sectional views (#1) showing a lead frame manufacturing method according to a first embodiment of the present invention respectively.
Figure 4B:
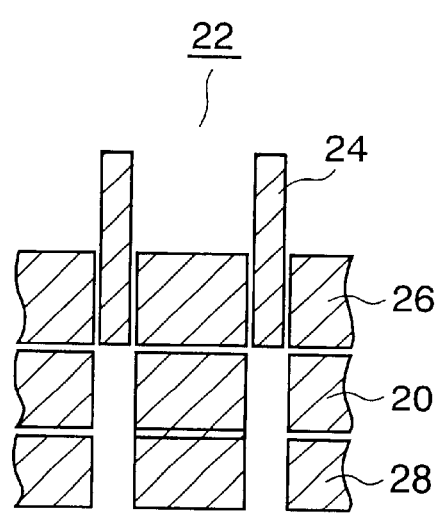

In the lead frame manufacturing method according to a first embodiment of the present invention, as shown in FIGS. 4A and 4B, first a metal plate 20 such as a Fe—Ni alloy plate, a Cu alloy plate, or the like, and a die 22 are prepared. This die 22 consists basically of first punches 24, a clamping member 26, and a support member 28. Then, the metal plate 20 is inserted between the clamping member 26 and the support member 28 and then predetermined portions of the metal plate 20 are pushed by the first punches 24, the metal plate 20 is punched or the thickness of predetermined portions is reduced. In this way, the lead frame can be manufactured. The first punches 24 are used to define roughly a width of a center portion of the lead portion of the lead frame.

In this way, the metal plate 20 is inserted into this die 22 and then the metal plate 20 is punched by pushing the metal plate 20 by the first punches 24. Thus, as shown in FIG. 4A, narrow first opening portions 20a are formed in desired portions of the metal plate 20 and also a rough width W1 of the center portion of the lead portion is defined. Then, curved portions (E and F portions) are formed at both end portions of the first opening portions 20a. In this case, FIG. 4B shows the behavior obtained after the metal plate 20 is punched by the first punches 24.

Figure 4C:
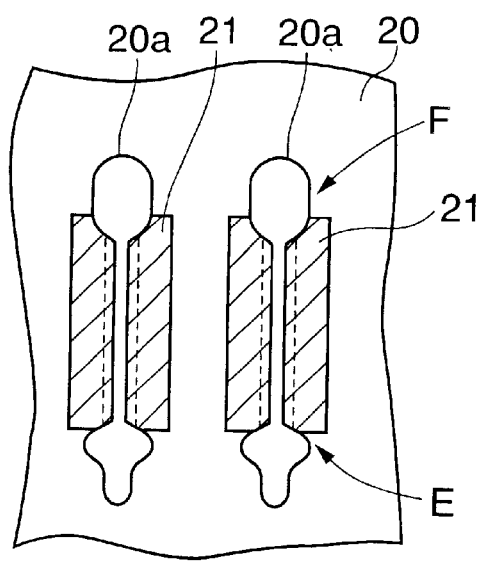
Figure 4D:
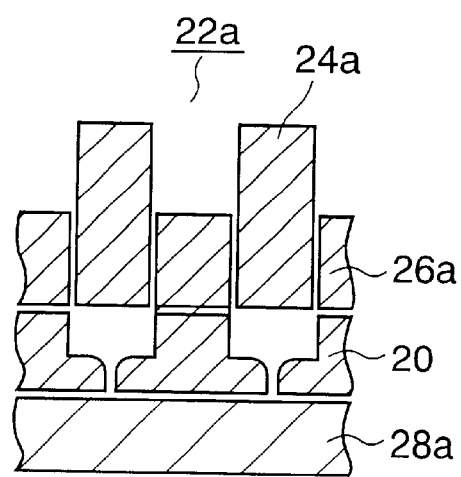

Then, as shown in FIG. 4D, a die 22a having second punches 24a, a clamping member 26a having opening portions that correspond to the second punches 24a, and a support member 28a with no opening portion is prepared. In this case, FIG. 4D shows the behavior obtained after the metal plate 20 is pushed by the second punches 24a. The second punches 24a of the die 22a is used to get the stepped shape by pushing portions, which correspond to the side surface portions of the center portion of the lead portion, to reduce a thickness of the portions. If viewed from the upper side, the second punches 24a have a rectangular planar shape containing a hatched area 21 in FIG. 4C respectively.

The metal plate 20 in which the first opening portions 20a are formed is inserted into this die 22a and then is pushed by the second punches 24a. Thus, as shown in FIG. 4D, a thickness of the hatched area 21 adjacent to the center portion of the first opening portion 20a of the metal plate 20 is reduced to almost half, for example. Also, as shown in FIG. 4C, since the portions of the metal plate 20 being pushed by the second punches 24a are extended to the inside of the first opening portion 20a, a width of the first opening portion 20a is narrowed (portions indicated by a broken line show a width of the first opening portion prior to the spread).

In the present embodiment, edge portions of the second punches 24a in the horizontal direction are formed to intersect with the curved portions (the E portion and the F portion in FIG. 4C) of the first opening portion 20a. Therefore, unlike the above C portion in FIG. 3C, generation of the burr can be prevented. A part of the hatched area 21 that is pushed by this step serves as the side surface portions of the center portion of the lead portion thereafter, and the side surface portions are formed like the stepped shape.

Then, as shown in FIG. 5B, a die 22b having third punches 24b, a clamping member 26b having opening portions that correspond to the third punches 24b, and a support member 28b is prepared. In this case, FIG. 5B shows the behavior obtained after the metal plate 20 is pushed by the third punches 24b. If viewed from the upper side, the third punches 24b have a planar shape shown by a hatched area 21a in FIG. 5A respectively. The third punches 24b are used to define a pitch between top end portions of the lead portions and also define a width of the center portion of the lead portion finally by punching again desired portions of the hatched areas 21, which are punched by the second punches 24a, as shown in above FIG. 4C, and are extended to the first opening portion 20a side.

Also, the third punches 24b are used to connect the top end portions and the center portions of the lead portions via first constriction portions 20c and connect the center portions and the base portions of the lead portions via second constriction portions 20d.

The metal plate 20 that is worked into the above shape shown in FIG. 4C is inserted into the die 22b and then desired portions of the metal plate 20 are punched by the third punches 24b. Thus, as shown in FIG. 5A, second opening portions 20b (hatched portions) are added to the metal plate 20. Accordingly, a width W3 of the top end portion of the lead portion is defined, and also a final width W2 of the center portion 30 of the lead portion is defined because the portions extended to the first opening portion 20a side are also punched. Also, the first constriction portions 20c and the second constriction portions 20d are formed in this step. In addition, since both side portions 30c of the center portion 30 of the lead portion have already pushed to reduce the thickness, such both side portions 30c of the center portion 30 of the lead portion are formed like the stepped shape.

Then, the metal plate 20 in which the above second opening portions are formed is inserted into the die (not shown) having fourth punches whose shape corresponds to a shape of a hatched area 21b in FIG. 5C, and then the hatched areas 21b of the metal plate 20 shown in FIG. 5C are punched by the fourth punches. Thus, the top end portions 30c of the lead portions are defined.

Then, the metal plate 20 in which the top end portions 30a of the lead portions are defined as above is inserted into the die (not shown) having fifth punches whose shape corresponds to a shape of a hatched area 21c in FIG. 6A. Then, a thickness of the top end portions 30a of the lead portions is reduced to almost half, for example, by pushing such top end portions 30a by virtue of the fifth punches. In this way, the top end portions 30a of the lead portions are formed like the stepped shape.

At this time, since the top end portions 30a and the center portions 30 are connected via the first constriction portions 20c, the fifth punches do not intersect with the side surface portions 30c of the center portions 30 of the lead portions. As a result, there is no possibility that the burr explained as above in FIGS. 3E and 3F is generated.

In this case, the mode in which a width of the top end portion 30a is narrower than a width of the center portion is shown in FIG. 6A. It is needless to say that a relationship between the widths of the top end portion 30a and the center portion 30 can be adjusted appropriately. That is, the fifth punches are not brought into contact with the side surface portions 30c of the center portions 30, which have been pushed by the second punches 24a, by providing the first constriction portions 20c between the side surface portions 30c and the top end portions 30a of the center portions 30.

Then, the metal plate 20 in which the above top end portions 30a of the lead portions are formed like the stepped shape is inserted into the die (not shown) having sixth punches whose shape corresponds to a shape of a hatched area 21d in FIG. 6B, and then hatched areas 21d of the metal plate 20 shown in FIG. 6B are punched. Thus, a width W4 of the base portion 30b of the lead portion is defined.

With the above, as shown in FIG. 6C, a lead frame 50, which has a lead portion 50a connected to a frame portion 50b, according to the first embodiment of the present invention is completed. In this case, FIG. 6C shows the back side of the metal plate 20 in which the steps in FIG. 6B are finished.

According to lead frame manufacturing method according to the first embodiment of the present invention, in the step of pushing the side surface portions 30c of the center portions 30 of the lead portion 50a by the second punches 24a (FIGS. 4C and 4D), the edge portions of the second punches 24a in the horizontal direction are formed to intersect with the curved portions (the E portions and the F portions in FIG. 4C) of the first opening portions 20a. Therefore, the above generation of the burr, which is generated at the C portion in FIG. 3C, can be prevented.

Also, in the step of pushing the top end portions 30a of the lead portions 50a by the fifth punches (FIG. 6A), the top end portions 30a and the side surface portions 30c of the center portions 30 are connected via the first constriction portions 20c. Thus, when the top end portions 30a are pushed by the fifth punches, the fifth punches do not come into contact with the side surface portions 30c of the center portions 30. Therefore, the above generation of the burr, which is generated at the D portion in FIG. 3E, can be prevented.

By doing this way, the lead frame 50 having the lead portions 50a, in which the side surface portions 30c of the center portions 30 and the top end portions 30a are formed like the stepped shape, can be manufactured easily by using the precision stamping die not to generate the burr. Since the working executed by the precision stamping die can accelerate the working speed more highly than the working executed by the etching in the prior art, a total cost of the lead frame can be lowered even when the precision stamping die is provided much more.

Figure 7:
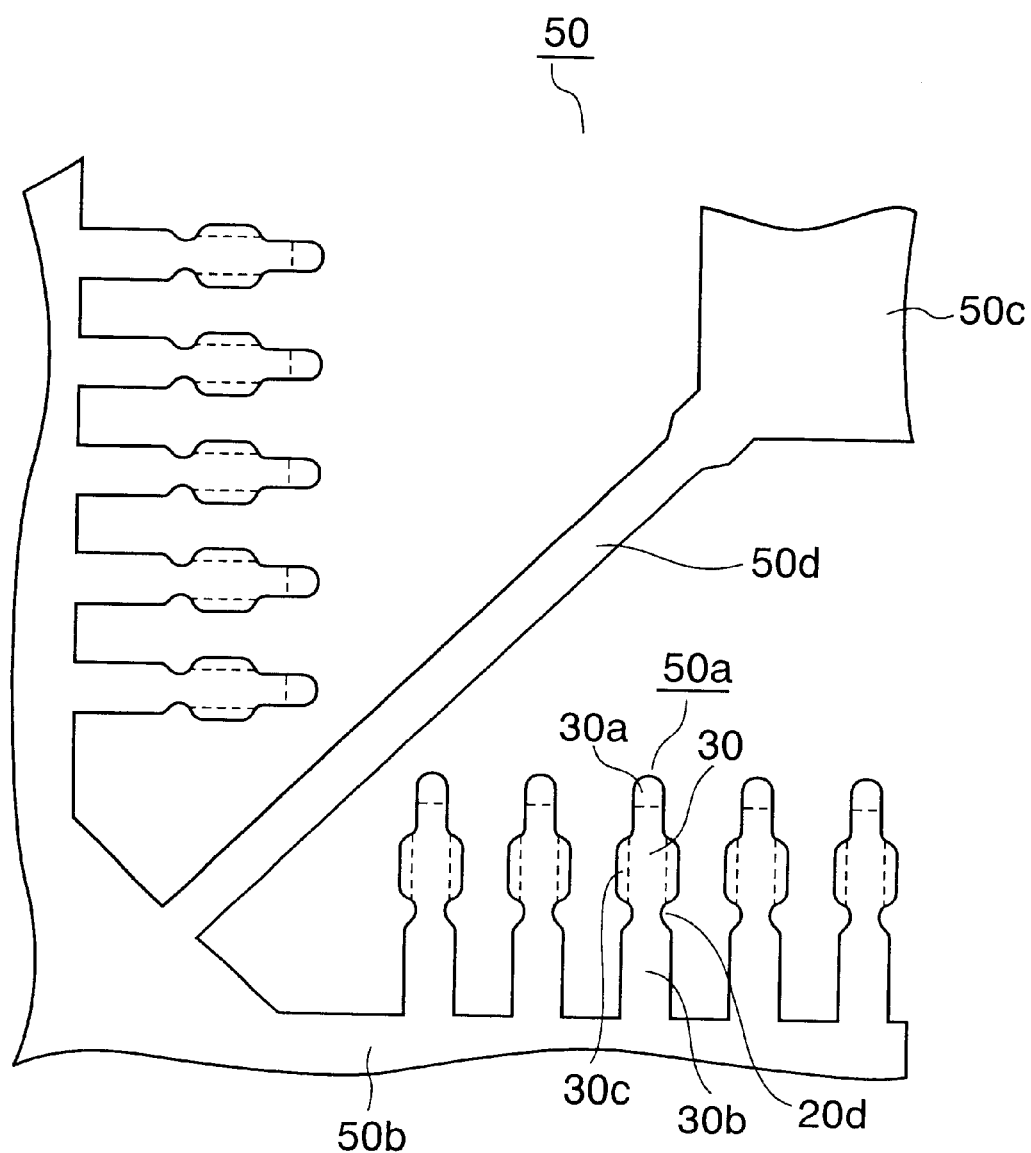
FIG. 7 is a partial plan view showing the lead frame according to the first embodiment of the present invention.

FIG. 7 is a partial plan view showing the lead frame according to the first embodiment of the present invention. In the lead frame 50 according to the first embodiment of the present invention, as shown in FIG. 7, a quadrilateral die pad 50c on which the IC chip is mounted is arranged in a center portion of the frame portion 50b. This die pad 50c is supported by support bars 50d that extend from respective corners of the frame portion 50b. In addition, a plurality of lead portions 50a shown in FIG. 6C extend toward the die pad 50c from the frame portions 50b like the teeth of a comb to constitute the lead frame 50.

In the lead frame 50 according to the present embodiment, the IC chip is mounted on the die pad 50c and then the connection electrodes of the IC chip and the center portions 30 of the lead portions 50a are connected electrically via the wires. Then, the mold resin is applied closely to the boundaries between the center portions 30 of the lead portions 50a and the base portions 30b, and then the semiconductor device is manufactured by cutting the mold resin at the portion of the base portions 30b on the center portion 30 side, preferably the second constriction portions 20d.

Figure 8:
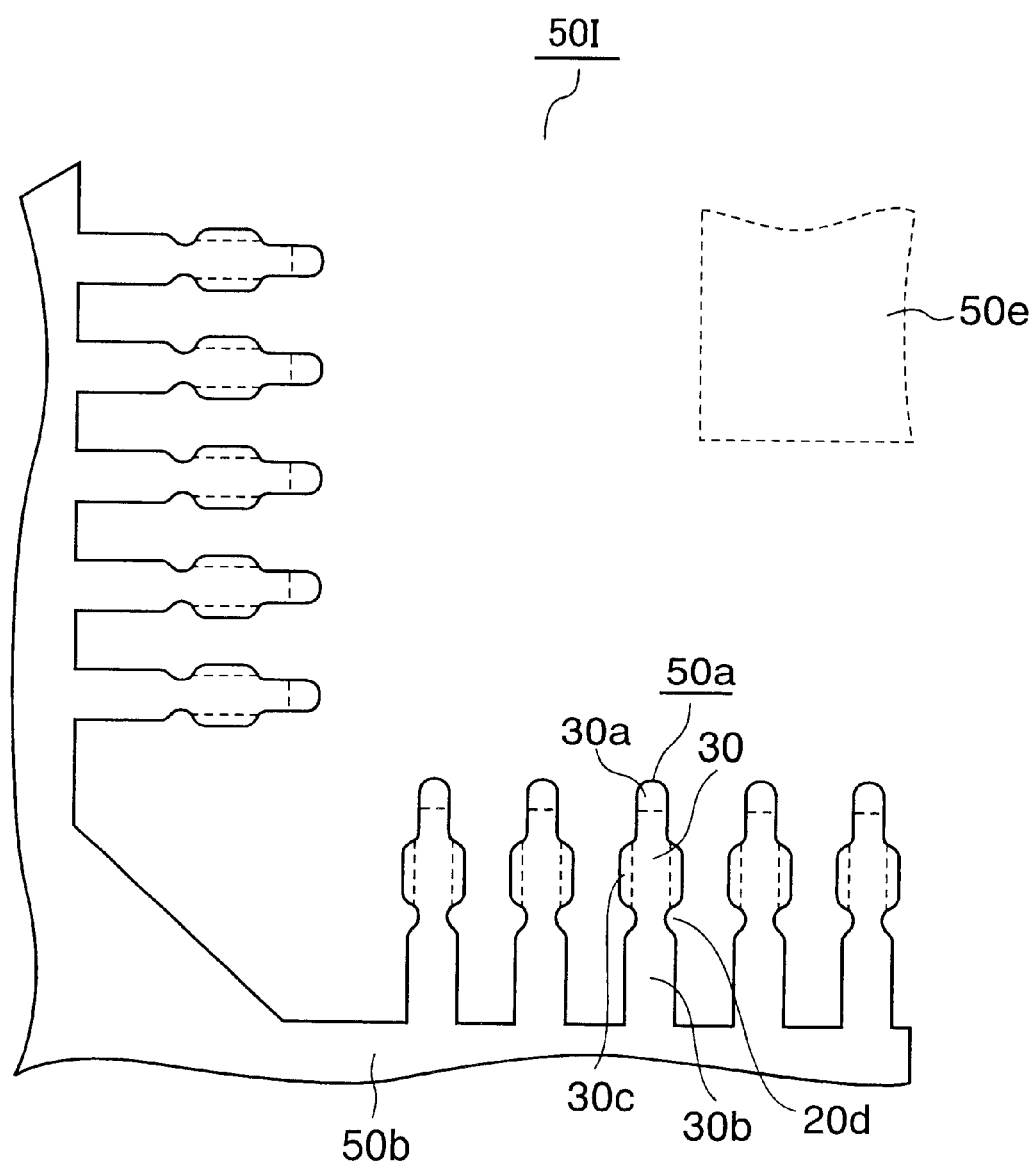
FIG. 8 is a partial plan view showing a lead frame according to a modification of the first embodiment of the present invention.

FIG. 8 is a partial plan view showing a lead frame according to a modification of the first embodiment of the present invention. As shown in FIG. 8, a lead frame 50I according to the modification of the first embodiment has a structure in which the die pad portion 50c is not provided to the lead frame 50 shown in FIG. 7. Then, like the lead frame 50 shown in FIG. 7, a plurality of lead portions 50a shown in FIG. 6C extend from the frame portion 50b to the inside like the teeth of a comb to constitute the lead frame 50.

In the lead frame 50 according to the modification of the present embodiment, the semiconductor device is manufactured such that the IC chip is arranged at the position of the center portion 50e in the cavity area on the inside of the frame portion 50b. In other words, first the tape is pasted onto a back surface of the lead frame 50I shown in FIG. 8 and then the IC chip is mounted onto the tape in the center portion 50e in the cavity area. Then, the connection electrodes of the IC chip are connected electrically to the center portions 30 of the lead portion 50a via the wires.

Then, the mold resin is applied up to the boundaries between the center portions 30 and the base portions 30b of the lead portion 50a. Thus, not only the lead portion 50a but also the IC chip can be secured by the mold resin. Then, the tape is peeled off and then the portions of the base portions 30b on the center portion 30 side, preferably the second constriction portions 20d are cut away.

In this manner, the semiconductor device in which the IC chip is packaged in the leadless package such as QFN, SON, or the like can be manufactured by using the lead frames 50, 50I according to the present embodiment.

In the manufacturing steps of the stamping, as shown in FIG. 6C, the shape of the lead portion in which the burr is not generated is formed such that the side surface portions 30c of the center portions 30 and the top end portions 30a are connected via the first constriction portions 20c and the side surface portions 30c of the center portions 30 and the base portions 30b are connected via the second constriction portions 20d. Also, since the side surface portions 30c of the center portions 30 and the top end portions 30a on the back side of the lead portion 40a (the surface connected to the wiring board, or the like) are formed like the stepped shape, the separation of the lead portion 50a from the mold resin can be prevented.

(Second Embodiment)

Figure 9A:
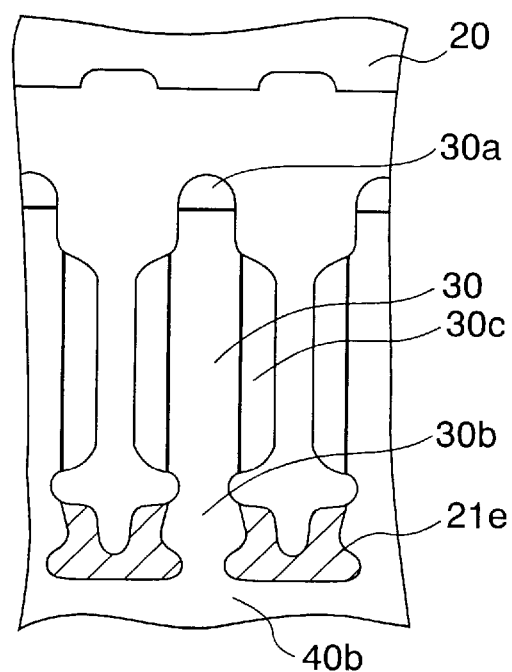
FIGS. 9A and 9B are partial plan views showing a lead frame manufacturing method according to a second embodiment of the present invention.
Figure 9B:
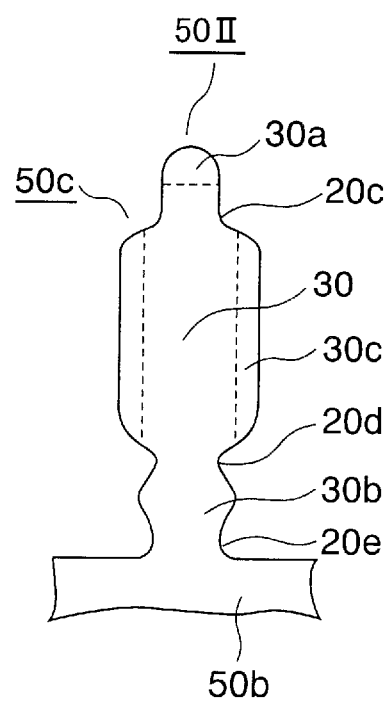

FIGS. 9A and 9B are partial plan views showing a lead frame manufacturing method according to a second embodiment of the present invention. A difference of the second embodiment from the first embodiment is that the base portions of the lead portions and the frame portions are connected via third constriction portions. In FIGS. 9A and 9B, the same references are affixed to the same elements as those in FIGS. 6A to 6C and their explanation will be omitted herein.

In the step shown in FIG. 6B in the first embodiment, when the hatched areas 21d are punched by the sixth punches, upper U-shaped edge portions of the hatched areas 21d have already been punched in the former step and thus the sticking force of punched metal residuum to the die is relatively small. Therefore, the punched metal residuum is stuck to the punches and then lifted. As a result, such a situation is supposed that the phenomenon of so-called "metal residuum lifting" occurs, e.g., the punched metal residuum enters into the space between the clamping member and the metal plate, etc. It is possible that, in the case that the metal residuum lifting occurs, there is caused the disadvantage such that the dent failure is generated. Thus, the second embodiment is provided to overcome such disadvantage.

In the lead frame manufacturing method according to a second embodiment of the present invention, first the metal plate is worked in the similar way to the first embodiment up to the step of pushing the top end portions 30a of the lead portions in FIG. 6A by the fifth punches.

Then, as shown in FIG. 9A, the hatched areas 21e of the metal plate 20 are punched by the die (not shown) having seventh punches that have the substantially same shape as the hatched areas 21e. At this time, in the hatched areas 21e of the punched metal plate 20, in the case that sides of the die in the vertical direction are shaped into the corrugated shape, for example, since the contact area between the punched metal residuum and the support member of the die is increased, the sticking force of the punched metal residuum to the support member of the die can be increased larger than the first embodiment. Therefore, generation of the metal residuum lifting can be prevented.

Accordingly, as shown in FIG. 9B, a lead frame 50II in which the base portion 30b of the lead portion 50c and the frame portion 50b are connected via a third constriction portion 20e is completed. In this case, in the present embodiment, the lead frame having the die pad portion may be employed like the first embodiment, otherwise the lead frame without the die pad portion may be employed.

According to the lead frame 50II in the second embodiment, not only the top end portion 30a of the lead portion 50c and the side surface portions 30c of the center portion 30 are connected via the first constriction portion 20c, and the side surface portions 30c of the center portion 30 and the base portion 30b are connected via the second constriction portion 20d, but also the base portion 30b and the frame portion 50b are connected via the third constriction portion 20e.

By making the lead portion 50c into the above shape, the lead frame 50II having the lead portions 50c, in which the top end portions 30a and the side surface portions 30c of the center portions 30 are formed like the stepped shape, can be manufactured by the stamping to use the precision stamping die not to generate the burr and the metal residuum lifting. As a result, the lead frames of the leadless package with high reliability can be manufactured by the stamping to use the precision stamping die.

What is claimed is:

1. A lead frame manufacturing method of manufacturing a lead frame including lead portions, which are extended from a frame portion toward an inside like a teeth of a comb and each of which has a top end portion, a center portion, and a base portion connected to the frame portion, by a stamping to use a die, comprising the steps of:

forming a plurality of first opening portions, which are formed in almost parallel mutually and each of which includes a narrow center portion and curved both end portions, by punching predetermined portions of a metal plate by a first punch of the die;

spreading the metal plate to an inside of the first opening portion by push predetermined portions of the metal plate near the center portion and at least a part of both end portions of the first opening portion by a second punch of the die so as to reduce a thickness of the metal plate;

forming a plurality of second opening portions, which are formed in almost parallel mutually, by punching predetermined portions of the metal plate in outer peripheral portions of the first opening portions by a third punch of the die such that a width of the center portion and a width of the top end portion are defined, and that the center portion and the top end portion, the center portion and the base portion are connected via a first constriction portion and a second constriction portion respectively; and defining top end portions of the lead portions by punching predetermined portions of the metal plate, which connect the second opening portions mutually, by a fourth punch of the die;

reducing a thickness of the top end portions by pushing the top end portions by a fifth punch of the die; and defining a width of the base portion by punching predetermined portions of the metal plate, which connect the second opening portions mutually, by a sixth punch of the die.

2. A lead frame manufacturing method according to claim 1, wherein, in the step of defining the width of the base portion, the predetermined portions of the metal plate are punched such that the base portion and the frame portion are connected via a third constriction portion.

* * * * *